United States Patent
Ashida et al.

(10) Patent No.: US 12,341,485 B2
(45) Date of Patent: Jun. 24, 2025

(54) MULTILAYER FILTER

(71) Applicant: TDK CORPORATION, Tokyo (JP)

(72) Inventors: Yuta Ashida, Tokyo (JP); Shuhei Sawaguchi, Tokyo (JP); Masahiro Tatematsu, Tokyo (JP); Keigo Shibuya, Tokyo (JP); Tomonori Terui, Tokyo (JP); Tetsuzo Goto, Tokyo (JP)

(73) Assignee: TDK CORPORATION, Tokyo (JP)

( * ) Notice: Subject to any disclaimer, the term of this patent is extended or adjusted under 35 U.S.C. 154(b) by 199 days.

(21) Appl. No.: 18/361,410

(22) Filed: Jul. 28, 2023

(65) Prior Publication Data

US 2024/0048112 A1 Feb. 8, 2024

(30) Foreign Application Priority Data

Aug. 3, 2022 (JP) .................. 2022-124129

(51) Int. Cl.
*H03H 7/01* (2006.01)
*H03H 1/00* (2006.01)

(52) U.S. Cl.
CPC ........ *H03H 7/0115* (2013.01); *H03H 7/0161* (2013.01); *H03H 2001/0085* (2013.01)

(58) Field of Classification Search
CPC .......... H03H 7/00; H03H 7/01; H03H 7/0115; H03H 7/0161; H03H 7/1725; H03H 7/1758; H03H 7/1775; H03H 7/1766; H03H 7/1783; H03H 7/1791; H03H 7/17; H03H 2001/0085; H03H 9/0561; H03H 9/131

USPC ................ 333/167, 181, 182, 183, 184, 185
See application file for complete search history.

(56) References Cited

U.S. PATENT DOCUMENTS

| | | | | |
|---|---|---|---|---|
| 11,356,073 B2* | 6/2022 | Sato | ..................... | H03H 7/0115 |
| 12,034,426 B2* | 7/2024 | Ogawa | ................. | H03H 7/0115 |
| 12,267,057 B2* | 4/2025 | Nakatsutsumi | ...... | H03H 7/0115 |
| 2021/0344320 A1 | 11/2021 | Sawaguchi et al. | | |
| 2022/0416754 A1 | 12/2022 | Sawaguchi et al. | | |

FOREIGN PATENT DOCUMENTS

JP 2021-175151 A 11/2021

* cited by examiner

*Primary Examiner* — Hai L Nguyen
(74) *Attorney, Agent, or Firm* — Oliff PLC

(57) ABSTRACT

In a multilayer filter, first to fourth resonant circuits are connected to an input/output portion. The input/output portion includes an input/output port group including an unbalanced port and a pair of balanced ports or an input/output port group including two pairs of balanced ports. Each of the first to fourth resonant circuits includes an inductor conductor and first and second capacitor conductors. The inductor conductor includes first and second ends. The first capacitor conductor is connected to the first end. The second capacitor conductor is connected to the second end. The second and third resonant circuits are magnetically coupled to each other. The second and third resonant circuits are arranged between the first resonant circuit and the fourth resonant circuit in a first direction. Each of first and second electrodes of a jump capacitor conductor is connected to the inductor conductors of the first and fourth resonant circuits.

7 Claims, 12 Drawing Sheets

MULTILAYER FILTER

BACKGROUND OF THE INVENTION

1. Field of the Invention

The present invention relates to a multilayer filter.

2. Description of Related Art

A known multilayer filter includes a multilayer body and a conductor unit. For example, the multilayer body is formed by stacking a plurality of dielectric layers. The conductor unit is provided inside the multilayer body. The conductor unit includes an input/output portion and a plurality of resonant circuits. The input/output portion includes an input/output port group including a plurality of ports. In the example illustrated in Japanese Unexamined Patent Publication No. 2021-175151, the input/output portion includes an unbalanced port and a balanced port.

SUMMARY OF THE INVENTION

A balanced multilayer filter is used as, for example, a bandpass filter for processing a balanced signal. The balanced multilayer filter includes a balanced-balanced filter as well as an unbalanced-balanced filter such as the above-described multilayer filter. If a steep attenuation pole is formed in the bandpass filter, filtering processing can be performed more reliably. However, in a balanced multilayer filter including a plurality of resonant circuits, it has been difficult to adjust the attenuation pole. Therefore, it has been difficult to form an attenuation pole having a desired shape.

It is an object of one aspect of the present invention to provide a multilayer filter in which an attenuation pole can be formed in a desired shape.

A multilayer filter according to one aspect of the present invention includes a multilayer body and a conductor unit. In the multilayer body, a plurality of dielectric layers are stacked. The conductor unit is provided inside the multilayer body. The conductor unit includes an input/output portion, first, second, third, and fourth resonant circuits, and a jump capacitor. The first, second, third, and fourth resonant circuits are connected to the input/output portion. The jump capacitor connects the first resonant circuit and the fourth resonant circuit to each other. The input/output portion includes an input/output port group including an unbalanced port and a pair of balanced ports or an input/output port group including two pairs of balanced ports. Each of the first, second, third, and fourth resonant circuits includes an inductor conductor, a first capacitor conductor, and a second capacitor conductor. The inductor conductor includes first and second ends. The first capacitor conductor is connected to the first end. The second capacitor conductor is connected to the second end. Among the first, second, third, and fourth resonant circuits, the second and third resonant circuits are adjacent to each other in a first direction crossing a stacking direction of the plurality of dielectric layers. The second resonant circuit and the third resonant circuit are magnetically coupled to each other. A first electrode of the jump capacitor is connected to the inductor conductor of the first resonant circuit. A second electrode of the jump capacitor is connected to the inductor conductor of the fourth resonant circuit.

In this multilayer filter, the input/output portion includes an input/output port group including an unbalanced port and a pair of balanced ports or an input/output port group including two pairs of balanced ports. The second resonant circuit and the third resonant circuit are adjacent to each other and magnetically coupled to each other. The jump capacitor is connected to the inductor conductor of the first resonant circuit and the inductor conductor of the fourth resonant circuit. According to the configuration in which the second resonant circuit and the third resonant circuit are magnetically coupled to each other in this manner, a steep attenuation pole is formed. In addition, a steeper attenuation pole is formed by the jump capacitor.

In the one aspect described above, the first, second, third, and fourth resonant circuits may be arranged in the first direction crossing the stacking direction of the plurality of dielectric layers. The second and third resonant circuits may be arranged between the first resonant circuit and the fourth resonant circuit in the first direction. In this case, the multilayer filter can be configured compactly while securing the characteristics of the multilayer filter.

In the one aspect described above, the jump capacitor may include a first jump capacitor and a second jump capacitor. A first electrode of the first jump capacitor may be connected to the first end of the first resonant circuit. A second electrode of the first jump capacitor may be connected to the first end of the fourth resonant circuit. A first electrode of the second jump capacitor may be connected to the second end of the first resonant circuit. A second electrode of the second jump capacitor may be connected to the second end of the fourth resonant circuit. In this case, a steeper attenuation pole is formed. In particular, a low-frequency attenuation pole is formed steeply. Balanced characteristics can also be improved.

In the one aspect described above, the input/output portion may include the input/output port group including the unbalanced port and the pair of balanced ports. A capacitance value of the first jump capacitor and a capacitance value of the second jump capacitor may be different. In this case, the attenuation pole can be adjusted more reliably.

In the one aspect described above, the input/output portion may include the input/output port group including the two pairs of balanced ports. A capacitance value of the first jump capacitor and a capacitance value of the second jump capacitor may be equivalent to each other. In this case, the attenuation pole can be adjusted more reliably.

In the one aspect described above, the multilayer filter may further include a capacitor conductor connecting the inductor conductor of the second resonant circuit and the inductor conductor of the third resonant circuit to each other. In this case, the attenuation pole can be adjusted more easily.

In the one aspect described above, the inductor conductor of the fourth resonant circuit may include first and second inductor conductors electrically connected to each other. The first inductor conductor may include the first end and a third end. The third end may be connected to the second inductor conductor. The second inductor conductor may include the second end and a fourth end. The fourth end may be connected to the third end of the first inductor conductor. The pair of balanced ports included in the input/output portion may include a balanced port connected to the first end and a balanced port connected to the second end. The third end and the fourth end may be connected to an external terminal. In this case, for example, a ground terminal or an RF ground terminal can be connected to the external terminal. As a result, the attenuation pole can be adjusted more reliably.

The present invention will become more fully understood from the detailed description given hereinafter and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF EMBODIMENTS

Figure 1:
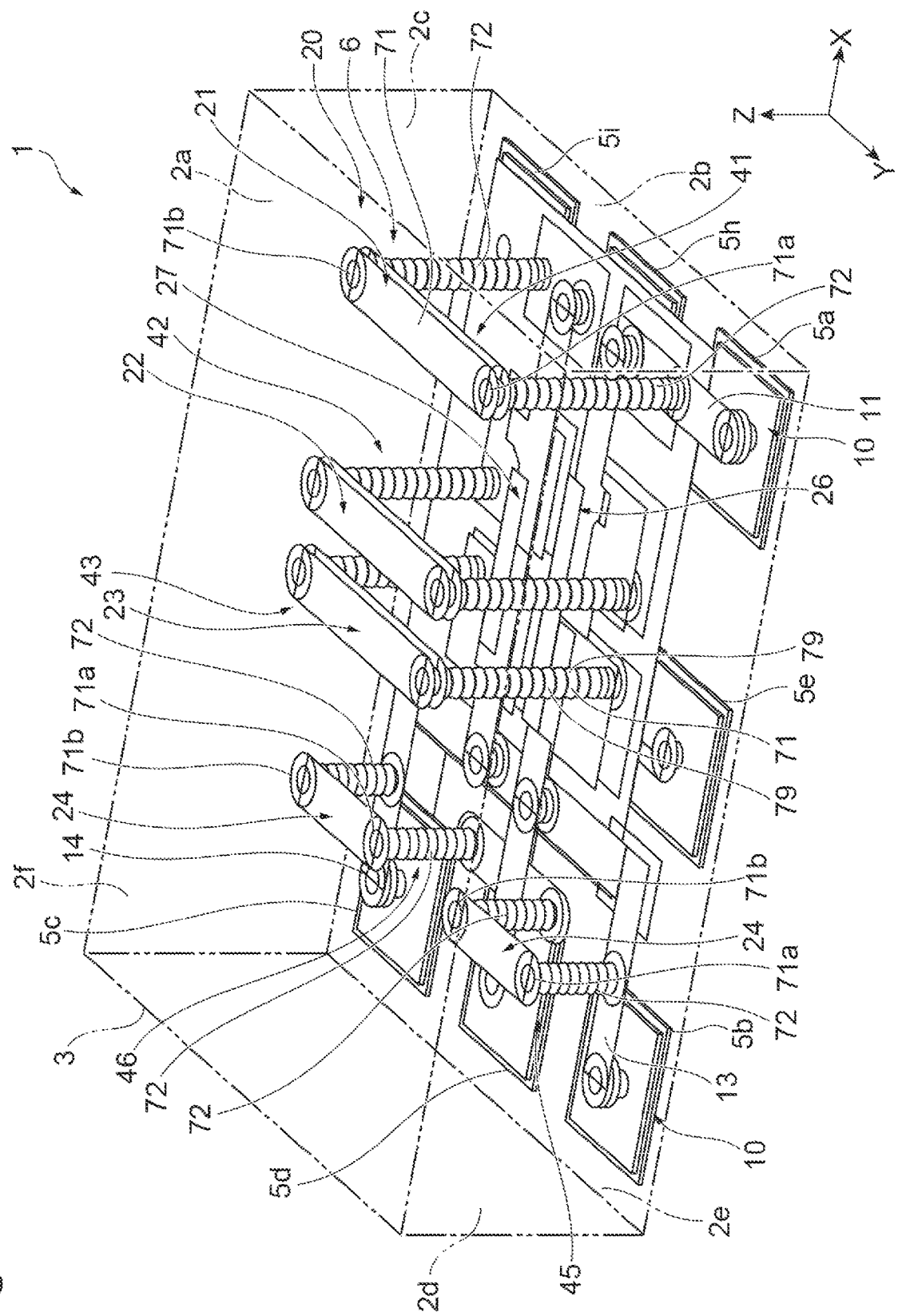
FIG. 1 is a perspective view of a multilayer filter according to the present embodiment.

Hereinafter, embodiments of the present invention will be described in detail with reference to the accompanying drawings. In the description of the diagrams, the same reference numerals are used for the same or equivalent elements, and repeated description thereof will be omitted.

Figure 2:
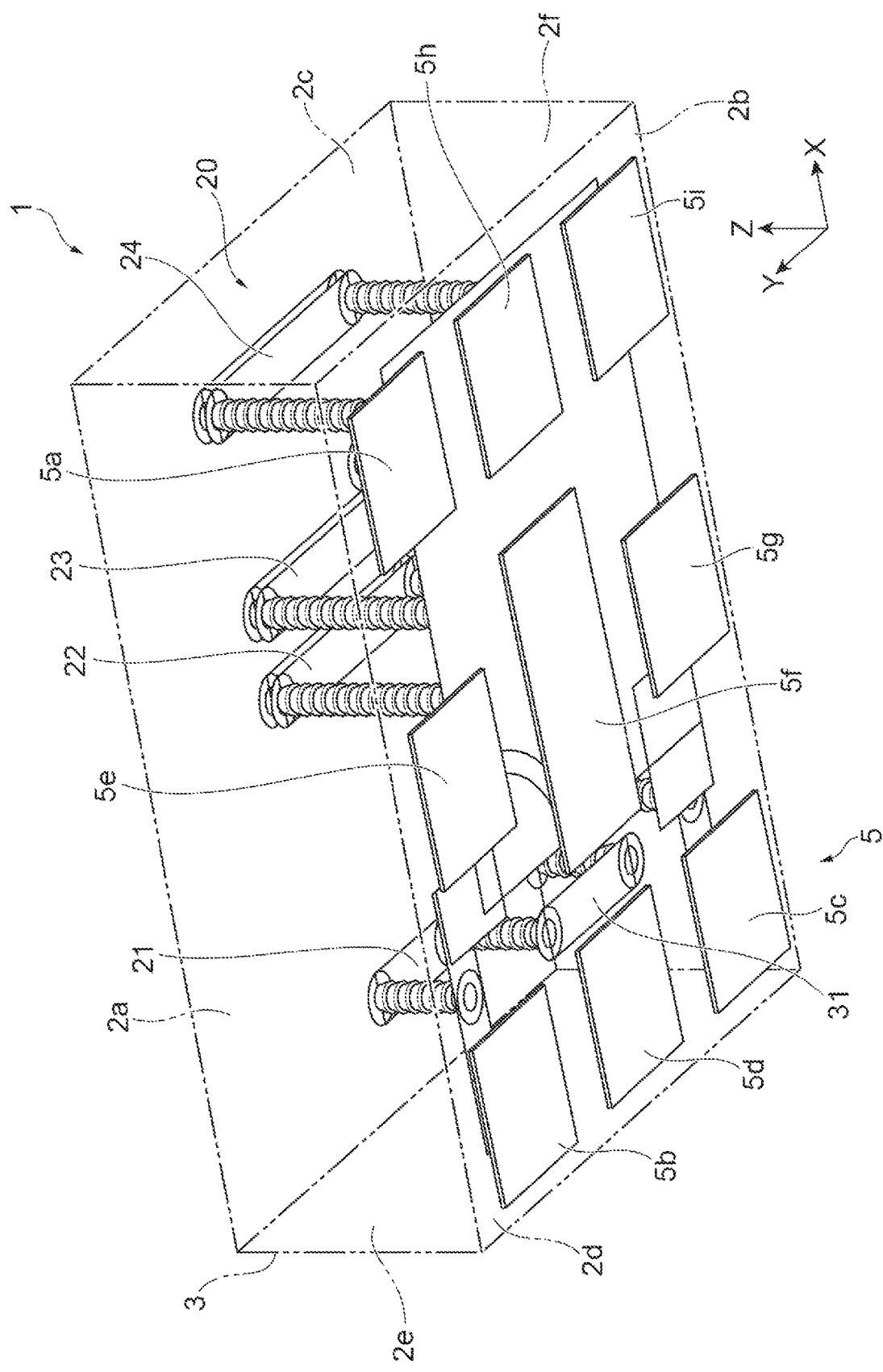
FIG. 2 is a perspective view of the multilayer filter.
Figure 3:
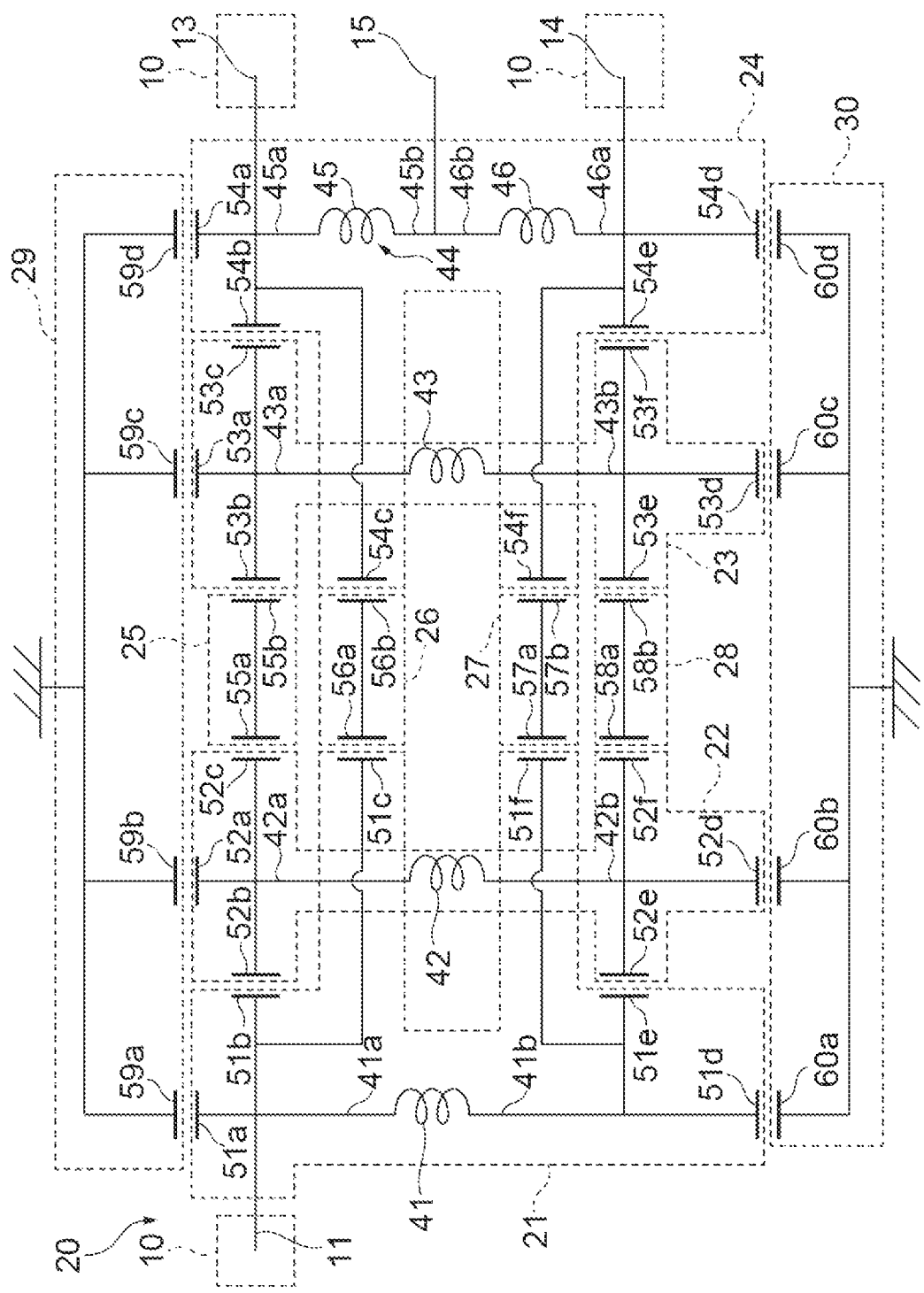
FIG. 3 is a circuit diagram of the multilayer filter.

First, a multilayer filter according to the present embodiment will be described with reference to FIGS. 1 to 3. FIGS. 1 and 2 are perspective views of the multilayer filter according to the present embodiment. The X-axis direction, the Y-axis direction, and the Z-axis direction are directions crossing each other. In the present embodiment, the X-axis direction, the Y-axis direction, and the Z-axis direction are perpendicular to each other. FIG. 3 is a circuit diagram of the multilayer filter. In this specification, "perpendicular" includes configurations that deviate within manufacturing tolerances.

A multilayer filter 1 is a balanced filter. The multilayer filter 1 includes a plurality of LC resonant circuits. The multilayer filter 1 includes, for example, a bandpass filter with unbalanced-balanced characteristics. The multilayer filter 1 processes a balanced signal, for example. When a balanced signal is used in the signal transmission method, noise is reduced compared with a case where no balanced signal is used. The multilayer filter 1 is solder-mounted in an electronic device, for example. The electronic device includes, for example, a circuit board or an electronic component. The multilayer filter 1 includes a multilayer body 3 and conductor units 5 and 6.

The multilayer body 3 has, for example, an insulating property. The multilayer body 3 is formed of, for example, a magnetic material. The magnetic material contains, for example, at least one selected from an Ni—Cu—Zn-based ferrite material, an Ni—Cu—Zn—Mg-based ferrite material, and an Ni—Cu-based ferrite material. The magnetic material forming the multilayer body 3 may contain an Fe alloy or the like. The multilayer body 3 may be formed of a non-magnetic material. The non-magnetic material contains, for example, at least one selected from a glass-ceramic material and a dielectric material.

The multilayer body 3 has, for example, a rectangular parallelepiped shape. Examples of the rectangular parallelepiped shape include a rectangular parallelepiped shape with chamfered corner portions and ridge portions and a rectangular parallelepiped shape with rounded corner portions and ridge portions. The shape of the multilayer body 3 is not limited to the rectangular parallelepiped shape. In the present embodiment, the Z-axis direction corresponds to the height direction of the multilayer body 3, and the X-axis direction and the Y-axis direction correspond to the short-length direction and longitudinal direction of the multilayer body 3. For example, the length of the multilayer body 3 in the height direction is shorter than the length of the multilayer body 3 in the short-length direction.

The multilayer body 3 has, as its outer surfaces, a pair of main surfaces 2a and 2b, a pair of end surfaces 2c and 2d, and a pair of side surfaces 2e and 2f. The pair of main surfaces 2a and 2b face each other in the Z-axis direction. The pair of end surfaces 2c and 2d face each other in the X-axis direction. The pair of side surfaces 2e and 2f face each other in the Y-axis direction. The pair of main surfaces 2a and 2b, the pair of end surfaces 2c and 2d, and the pair of side surfaces 2e and 2f are, for example, planes. The pair of main surfaces 2a and 2b extend along, for example, the X-axis direction and the Y-axis direction. The pair of end surfaces 2c and 2d extend along, for example, the Y-axis direction and the Z-axis direction. The pair of side surfaces 2e and 2f extend along, for example, the X-axis direction and the Z-axis direction.

For example, the main surface 2b is defined as a mounting surface facing another electronic device when mounted on another electronic device. The main surface 2a corresponds to a facing surface that faces the main surface 2b in the Z-axis direction.

The multilayer body 3 includes a plurality of dielectric layers. In the multilayer body 3, a plurality of dielectric layers are stacked in the Z-axis direction. In other words, the Z-axis direction corresponds to the stacking direction of a plurality of dielectric layers. Each dielectric layer corresponds to an insulator layer. Each dielectric layer is formed of, for example, a sintered body of a ceramic green sheet containing a dielectric material. The dielectric material contains, for example, at least one selected from a $BaTiO_3$-based material, a $Ba(Ti, Zr)O_3$-based material, a $(Ba, Ca)TiO_3$-based material, a glass material, and an alumina material.

In the example illustrated in the present embodiment, the length of the multilayer body 3 in the Y-axis direction is 1.25 mm. The length of the multilayer body 3 in the X-axis direction is 2.00 mm. The length of the multilayer body 3 in the Z-axis direction is 0.95 mm.

The conductor unit 5 is provided on the outer surface of the multilayer body 3. The conductor unit 5 is formed by using a known technique. The conductor unit 5 is formed of, for example, a metal material. The metal material is, for example, copper, silver, gold, nickel, or chromium. The conductor unit 5 is formed, for example, by performing plating processing on an electrode layer. The electrode layer is formed of, for example, a conductive paste. The conductive paste is applied by using, for example, a printing method or a transfer method. The plating processing is, for example, electrolytic plating or electroless plating. By the plating processing, a plating layer is formed on the outer surface of the conductive paste.

The conductor unit 5 includes a plurality of external electrodes 5a, 5b, 5c, 5d, 5e, 5f, 5g, 5h, and 5i spaced apart from each other. Each of the external electrodes 5a to 5i is connected to the conductor unit 6. Each of the external electrodes 5a to 5i is provided on the main surface 2b. Each of the external electrodes 5a to 5i has a rectangular shape. In this specification, "connected" means being connected in a state of direct contact. "Direct contact" means being connected to each other without another member illustrated in this specification being interposed. "Direct contact" does not exclude being connected through a member not specified in this specification.

The conductor unit 6 is provided inside the multilayer body 3. The conductor unit 6 includes an input/output portion 10, an external terminal 15, and a plurality of electrical circuits 20. The plurality of electrical circuits 20 are electromagnetically connected to each other inside the multilayer body 3 to form one filter circuit. In this specification, "electromagnetic connection" includes an electrical connection and a magnetic connection. "Electrical connection" includes a connection through which a DC component is transmitted and a connection through which only an AC component is transmitted without transmitting a DC component. In this specification, the electrical connection is also simply referred to as "connection".

Through the input/output portion 10, input signals are transmitted to the plurality of electrical circuits 20, and signals transmitted from the plurality of electrical circuits 20 are output. For example, a signal is input to the input/output portion 10 from the outside of the multilayer filter 1, and a signal is output from the input/output portion 10 to the outside of the multilayer filter 1. The input/output portion 10 includes an input/output port group including an unbalanced port 11 and a pair of balanced ports 13 and 14. Through the pair of balanced ports 13 and 14, balanced signals are input and output. In other words, a signal input and output to and from the balanced port 13 and a signal input and output to and from the balanced port 14 have opposite polarities.

The plurality of electrical circuits 20 are connected to the input/output portion 10. The plurality of electrical circuits 20 are electromagnetically connected to each other. The plurality of electrical circuits 20 include a plurality of resonant circuits. The plurality of electrical circuits 20 include electrical circuits 21, 22, 23, 24, 25, 26, 27, 28, 29, and 30. Each of the electrical circuits 21, 22, 23, and 24 includes a resonant circuit. The electrical circuits 21, 22, 23, and 24 are, for example, LC resonant circuits. Each of the electrical circuits 21, 22, 23, and 24 forms an inductor and a capacitor. Among the electrical circuits 21, 22, 23, and 24, the electrical circuits 22 and 23 are adjacent to each other in a direction crossing the stacking direction of the plurality of dielectric layers 7, and are magnetically coupled to each other. In the example illustrated in the present embodiment, the plurality of electrical circuits 21, 22, 23, and 24 are arranged in the direction crossing the stacking direction of the plurality of dielectric layers 7. The plurality of electrical circuits 21, 22, 23, and 24 are arranged in the X-axis direction. The electrical circuits 22 and 23 are arranged between the electrical circuits 21 and 24 in the X-axis direction. The plurality of electrical circuits 21, 22, 23, and 24 are electromagnetically connected to each other.

The electrical circuits 21, 22, 23, 24, 25, 26, 27, 28, 29, and 30 are spaced apart from each other. In this specification, when "spaced apart" is used for the electrical circuit, "spaced apart" means a state in which there is no physical connection through a conductor and no DC component is transmitted. The electrical circuits 21, 22, 23, 24, 25, 26, 27, 28, 29, and 30 are electrically connected to each other.

Each electrical circuit 20 is formed by a plurality of conductors. Conductors forming each electrical circuit 20 contain at least one selected from Ag and Pd, for example. A plating layer is formed on the surface of each terminal electrode. The plated layer is formed, for example, by electroplating. The plating layer has such as a layer structure including a Cu plating layer, an Ni plating layer, and an Sn plating layer, or a layer structure including an Ni plating layer and an Sn plating layer.

As illustrated in FIG. 3, the electrical circuit 21 includes an inductor conductor 41 and capacitor conductors 51a, 51b, 51c, 51d, 51e, and 51f. The inductor conductor 41 corresponds to a coil. The inductor conductor 41 includes a pair of ends 41a and 41b. The inductor conductor 41 forms an inductor. The capacitor conductors 51a, 51b, 51c, 51d, 51e, and 51f form capacitors. In the electrical circuit 21, the end 41a and the capacitor conductors 51a, 51b, and 51c are electrically connected to each other. The unbalanced port 11 and the end 41a are electrically connected to each other. In the electrical circuit 21, the end 41b and the capacitor conductors 51d, 51e, and 51f are electrically connected to each other.

In the multilayer filter 1, the electrical circuit 21 corresponds to at least a part of a first resonant circuit. The capacitor conductors 51a and 51b correspond to first capacitor conductors forming a first capacitor. The capacitor conductor 51c corresponds to a jump capacitor conductor forming a jump capacitor. For example, the capacitor conductor 51c corresponds to a first jump capacitor conductor forming a first jump capacitor. In the capacitor conductor 51c, the first jump capacitor conductor corresponds to a first electrode of a pair of electrodes forming the first jump capacitor.

The capacitor conductors 51d and 51e correspond to second capacitor conductors forming a second capacitor. The capacitor conductor 51f corresponds to a jump capacitor conductor forming a jump capacitor. For example, the capacitor conductor 51f corresponds to a second jump capacitor conductor forming a second jump capacitor. In the capacitor conductor 51f, the second jump capacitor conductor corresponds to a first electrode of a pair of electrodes forming the second jump capacitor.

The electrical circuit 22 includes an inductor conductor 42 forming an inductor and capacitor conductors 52a, 52b, 52c, 52d, 52e, and 52f forming capacitors. The inductor conductor 42 corresponds to a coil. The inductor conductor 42 includes a pair of ends 42a and 42b. The inductor conductor 42 forms an inductor. The electrical circuit 21 and the electrical circuit 22 are connected to each other by AC coupling. A capacitor is formed by the capacitor conductor 51b and the capacitor conductor 52b. The capacitor conductors 52a, 52b, 52c, 52d, 52e, and 52f form capacitors. In the electrical circuit 22, the end 42a and the capacitor conductors 52a, 52b, and 52c are electrically connected to each other. In the electrical circuit 22, the end 42b and the capacitor conductors 52d, 52e, and 52f are electrically connected to each other. In the multilayer filter 1, the electrical circuit 22 corresponds to at least a part of a second resonant circuit. The capacitor conductors 52a, 52b, and 52c correspond to first capacitor conductors forming a first capacitor. The capacitor conductors 52d, 52e, and 52f correspond to second capacitor conductors forming a second capacitor.

The electrical circuit 23 includes an inductor conductor 43 forming an inductor and capacitor conductors 53a, 53b, 53c, 53d, 53e, and 53f forming capacitors. The inductor conductor 43 corresponds to a coil. The inductor conductor 43 includes a pair of ends 43a and 43b. The inductor conductor 43 forms an inductor. The capacitor conductors 53a, 53b, 53c, 53d, 53e, and 53f form capacitors. In the electrical circuit 23, the end 43a and the capacitor conductors 53a, 53b, and 53c are electrically connected to each other. In the electrical circuit 23, the end 43b and the capacitor conductors 53d, 53e, and 53f are electrically connected to each other.

In the multilayer filter 1, the electrical circuit 23 corresponds to at least a part of a third resonant circuit. The capacitor conductors 53a, 53b, and 53c correspond to first capacitor conductors forming a first capacitor. The capacitor conductors 53d, 53e, and 53f correspond to second capacitor conductors forming a second capacitor.

The electrical circuit 24 includes an inductor conductor 44 forming an inductor and capacitor conductors 54a, 54b, 54c, 54d, 54e, and 54f forming capacitors. The inductor conductor 44 includes an inductor conductor 45 and an inductor conductor 46 electrically connected to each other. The inductor conductors 45 and 46 correspond to coils. The inductor conductor 45 includes a pair of ends 45a and 45b. The inductor conductor 46 includes a pair of ends 46a and 46b. The end 45b of the inductor conductor 45 and the end 46b of the inductor conductor 46 are connected to each other.

The inductor conductors 45 and 46 form inductors. The capacitor conductors 54a, 54b, 54c, 54d, 54e, and 54f form capacitors. In the electrical circuit 24, the end 45a and the capacitor conductors 54a, 54b, and 54c are electrically connected to each other. The balanced port 13 and the end 45a are electrically connected to each other. In the electrical circuit 24, the end 45b, the end 46b, and the external terminal 15 are electrically connected to each other. In the electrical circuit 24, the end 46a and the capacitor conductors 54d, 54e, and 54f are electrically connected to each other. The balanced port 14 and the end 46a are electrically connected to each other.

In the multilayer filter 1, the electrical circuit 24 corresponds to at least a part of a fourth resonant circuit. The capacitor conductors 54a and 54b correspond to first capacitor conductors forming a first capacitor. The capacitor conductor 54c corresponds to a jump capacitor conductor forming a jump capacitor. For example, the capacitor conductor 53c corresponds to a first jump capacitor conductor forming a first jump capacitor. In the capacitor conductor 53c, the first jump capacitor conductor corresponds to a second electrode of a pair of electrodes forming the first jump capacitor.

The capacitor conductors 54d and 54e correspond to second capacitor conductors forming a second capacitor. The capacitor conductor 54f corresponds to a jump capacitor conductor forming a jump capacitor. For example, the capacitor conductor 54f corresponds to a second jump capacitor conductor forming a second jump capacitor. In the capacitor conductor 54f, the second jump capacitor conductor corresponds to a second electrode of a pair of electrodes forming the second jump capacitor.

The electrical circuit 25 includes capacitor conductors 55a and 55b forming a capacitor. The electrical circuit 22 and the electrical circuit 25 are connected to each other by AC coupling. A capacitor is formed by the capacitor conductor 52c and the capacitor conductor 55a. The electrical circuit 23 and the electrical circuit 25 are connected to each other by AC coupling. A capacitor is formed by the capacitor conductor 53b and the capacitor conductor 55b. In the electrical circuit 25, the capacitor conductor 55a and the capacitor conductor 55b are electrically connected to each other.

The electrical circuit 26 includes capacitor conductors 56a and 56b forming a capacitor. The electrical circuit 21 and the electrical circuit 26 are connected to each other by AC coupling. A capacitor is formed by the capacitor conductor 51c and the capacitor conductor 56a. The electrical circuit 24 and the electrical circuit 26 are connected to each other by AC coupling. A capacitor is formed by the capacitor conductor 54c and the capacitor conductor 56b. In the electrical circuit 26, the capacitor conductor 56a and the capacitor conductor 56b are electrically connected to each other.

A jump capacitor is formed by the electrical circuit 26 and the capacitor conductors 51c and 54c. For example, a first jump capacitor is formed by the electrical circuit 26 and the capacitor conductors 51c and 54c. The first jump capacitor connects the electrical circuit 21 and the electrical circuit 24 to each other by jumping over the electrical circuit 22 and the electrical circuit 23 arranged adjacent to each other in the X-axis direction. In other words, the first jump capacitor connects the electrical circuit 21 and the electrical circuit 24, which are arranged so as to interpose the electrical circuit 22 and the electrical circuit 23 magnetically coupled to each other, to each other in the X-axis direction.

The electrical circuit 27 includes capacitor conductors 57a and 57b forming a capacitor. The electrical circuit 21 and the electrical circuit 27 are connected to each other by AC coupling. A capacitor is formed by the capacitor conductor 51f and the capacitor conductor 57a. The electrical circuit 24 and the electrical circuit 27 are connected to each other by AC coupling. A capacitor is formed by the capacitor conductor 54f and the capacitor conductor 57b. In the electrical circuit 27, the capacitor conductors 57a and 57b are electrically connected to each other.

A jump capacitor is formed by the electrical circuit 27 and the capacitor conductors 51f and 54f. For example, a second jump capacitor is formed by the electrical circuit 27 and the capacitor conductors 51f and 54f. The second jump capacitor connects the electrical circuit 21 and the electrical circuit 24 to each other by jumping over the electrical circuit 22 and the electrical circuit 23 arranged adjacent to each other in the X-axis direction. In other words, the second jump capacitor connects the electrical circuit 21 and the electrical circuit 24, which are arranged so as to interpose the electrical circuit 22 and the electrical circuit 23 magnetically coupled to each other, to each other in the X-axis direction. In the multilayer filter 1, the capacitance of the first jump capacitor and the capacitance of the second jump capacitor are different from each other.

The electrical circuit 28 includes capacitor conductors 58a and 58b forming a capacitor. The electrical circuit 22 and the electrical circuit 28 are connected to each other by AC coupling. A capacitor is formed by the capacitor conductor 52f and the capacitor conductor 58a. The electrical circuit 23 and the electrical circuit 28 are connected to each other by AC coupling. A capacitor is formed by the capacitor conductor 53e and the capacitor conductor 58b. In the electrical circuit 28, the capacitor conductor 58a and the capacitor conductor 58b are electrically connected to each other.

The electrical circuit 29 includes capacitor conductors 59a, 59b, 59c, and 59d forming capacitors. The electrical circuit 21 and the electrical circuit 29 are connected to each other by AC coupling. The electrical circuit 22 and the electrical circuit 29 are connected to each other by AC coupling. The electrical circuit 23 and the electrical circuit 29 are connected to each other by AC coupling. The electrical circuit 24 and the electrical circuit 29 are connected to each other by AC coupling. In the electrical circuit 29, the capacitor conductors 59a, 59b, 59c, and 59d are grounded. A capacitor is formed by the capacitor conductor 51a and the capacitor conductor 59a. A capacitor is formed by the capacitor conductor 52a and the capacitor conductor 59b. A capacitor is formed by the capacitor conductor 53a and the capacitor conductor 59c. A capacitor is formed by the capacitor conductor 54a and the capacitor conductor 59d.

The electrical circuit 30 includes capacitor conductors 60a, 60b, 60c, and 60d forming capacitors. The electrical circuit 21 and the electrical circuit 30 are connected to each other by AC coupling. The electrical circuit 22 and the electrical circuit 30 are connected to each other by AC coupling. The electrical circuit 23 and the electrical circuit 30 are connected to each other by AC coupling. The electrical circuit 24 and the electrical circuit 30 are connected to each other by AC coupling. In the electrical circuit 30, the capacitor conductors 60a, 60b, 60c, and 60d are grounded. A capacitor is formed by the capacitor conductor 51d and the capacitor conductor 60a. A capacitor is formed by the capacitor conductor 52d and the capacitor conductor 60b. A capacitor is formed by the capacitor conductor 53d and the capacitor conductor 60c. A capacitor is formed by the capacitor conductor 54d and the capacitor conductor 60d.

As illustrated in FIG. 2, the inductor conductors 41, 42, 43, 45, and 46 are arranged inside the multilayer body 3. The inductor conductors 41, 42, 43, 45, and 46 have coil axes along a direction perpendicular to the stacking direction. The inductor conductors 41, 42, 43, 45, and 46 have coil axes along the X-axis direction.

In the present embodiment, the inductor conductors 41, 42, 43, 45, and 46 are single turn coils. Each of inductor conductors 41, 42, 43, 45, and 46 includes, for example, at least one conductor layer 71 and a plurality of connection conductors 72. The conductor layer 71 extends along the dielectric layer of the multilayer body 3. The conductor layer 71 is interposed between a pair of dielectric layers. The conductor layer 71 includes a pair of ends 71a and 71b located opposite to each other.

Each of the plurality of connection conductors 72 is connected to the conductor layer 71. Each connection conductor 72 extends in the Z-axis direction. Each connection conductor 72 is formed by a plurality of vias 79 penetrating the dielectric layer. In other words, each of the inductor conductors 41, 42, 43, 45, and 46 includes the conductor layer 71 and a plurality of vias 79. The plurality of vias 79 are electrically connected to corresponding conductor layers among the plurality of conductor layers 71. The plurality of vias 79 are arranged in the stacking direction. The plurality of connection conductors 72 include the connection conductor 72 connected to the end 71a and the connection conductor 72 connected to the end 71b.

For example, the external electrode 5a is connected to the unbalanced port 11, and is connected to the connection conductor 72 of the end 41a of the inductor conductor 41 through the unbalanced port 11. The external electrode 5b is connected to the balanced port 13, and is connected to the connection conductor 72 of the end 45a of the inductor conductor 45 through the balanced port 13. The external electrode 5c is connected to the balanced port 14, and is connected to the connection conductor 72 of the end 41b of the inductor conductor 46 through the balanced port 14. The external electrode 5d corresponds to the external terminal 15 of the electrical circuit 24. The external electrodes 5e, 5f, 5g, 5h, and 5i are connected to the capacitor conductors 59a, 59b, 59c, and 59d and the capacitor conductors 60a, 60b, 60c, and 60d.

Figure 4:
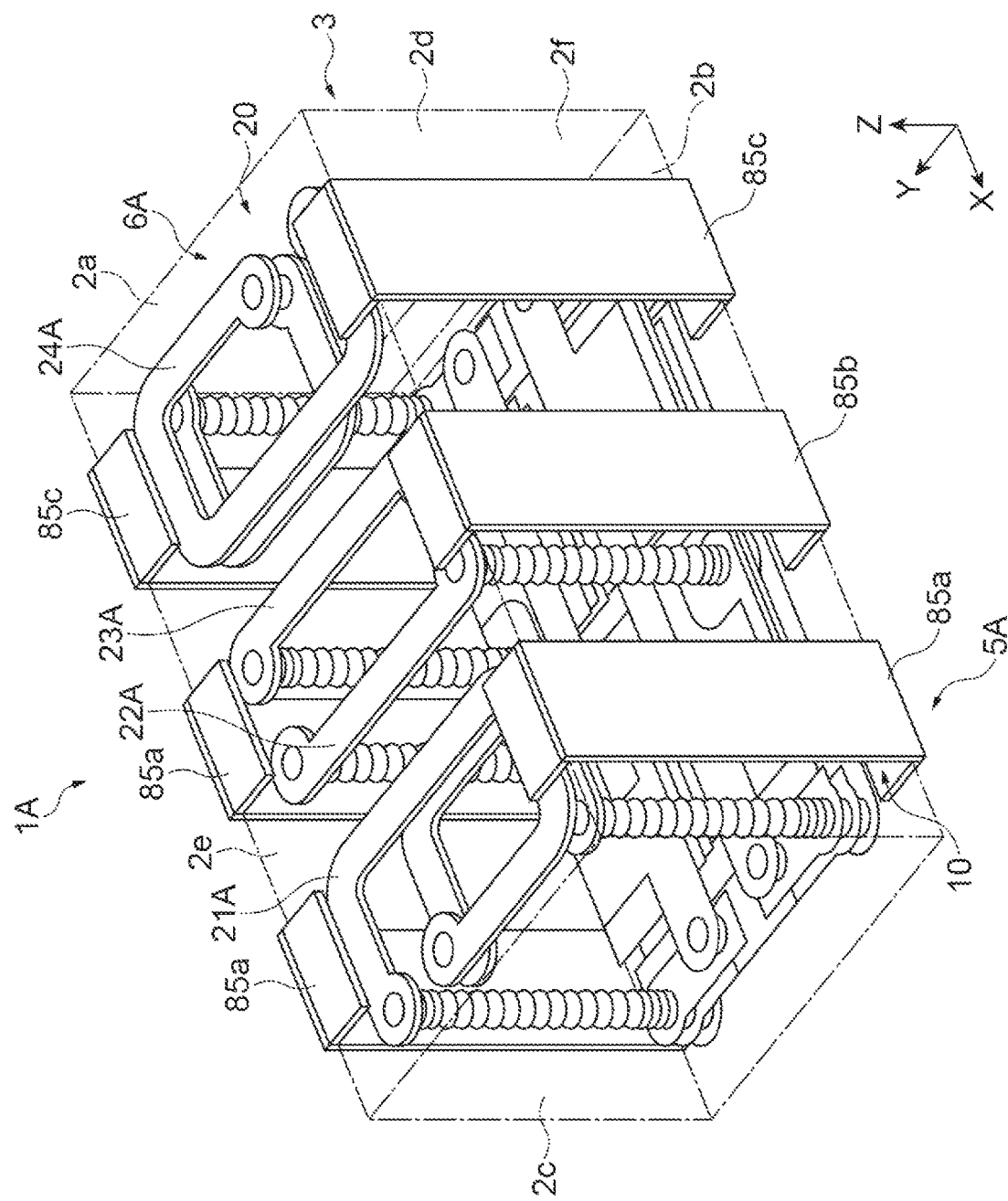
FIG. 4 is a perspective view of a multilayer filter according to a modification example of the present embodiment.
Figure 5:
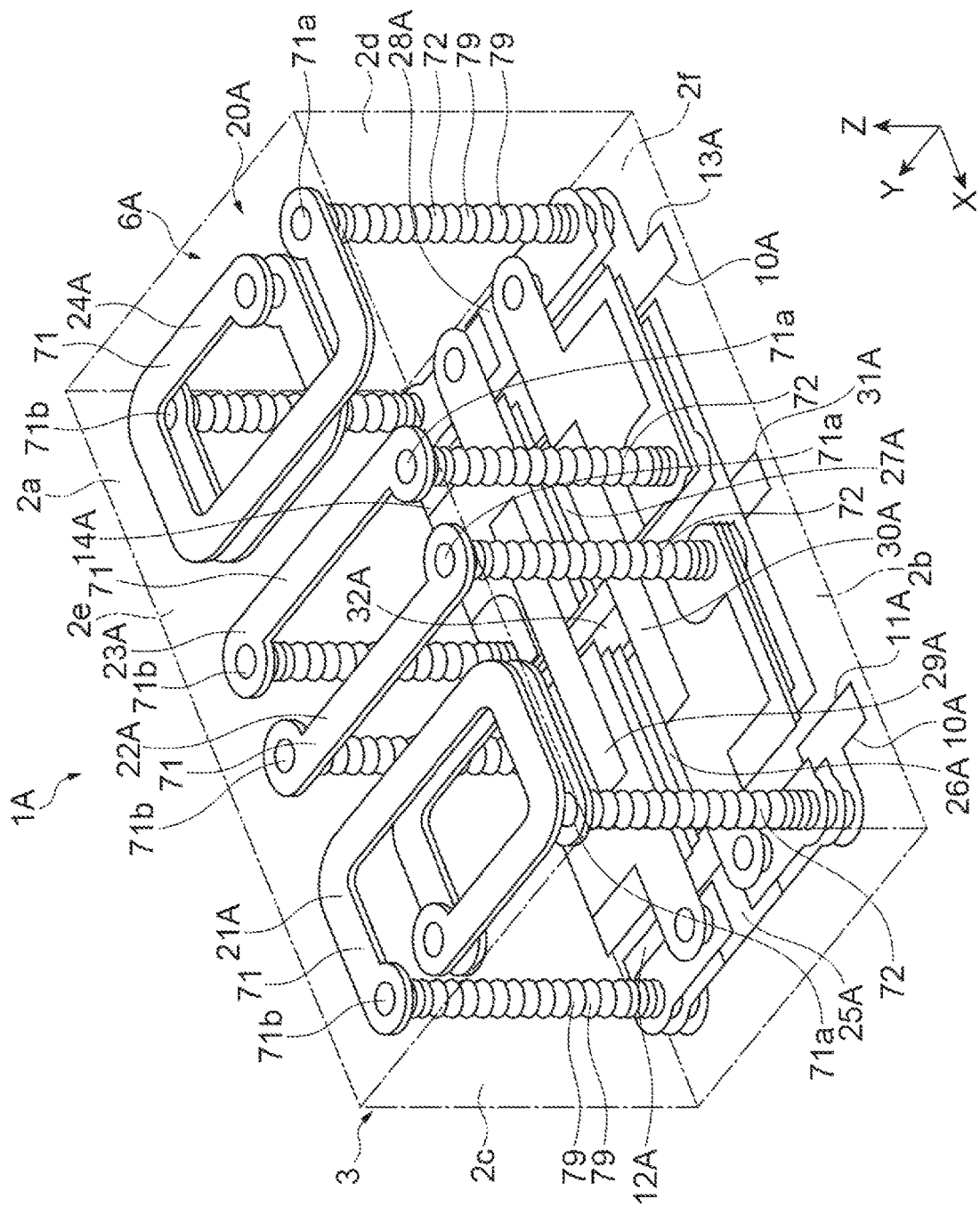
FIG. 5 is a perspective view of the multilayer filter according to the modification example of the present embodiment.
Figure 6:
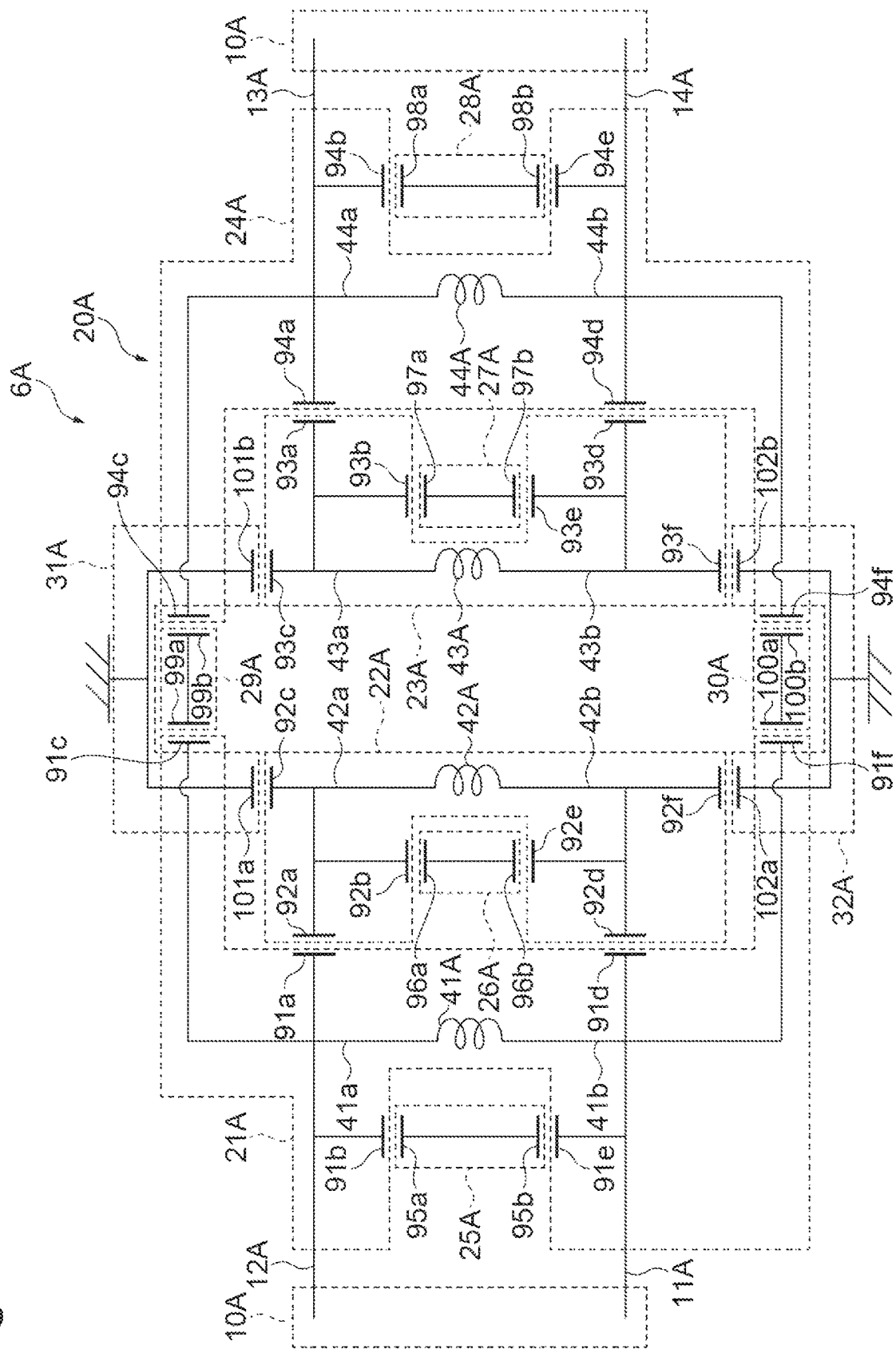
FIG. 6 is a circuit diagram of the multilayer filter according to the modification example of the present embodiment.

Next, a multilayer filter according to a modification example of the present embodiment will be described with reference to FIGS. 4 to 6. FIG. 4 is a perspective view of the multilayer filter according to the modification example of the present embodiment. FIG. 5 is a perspective view of the multilayer filter according to the modification example. FIG. 6 is a circuit diagram of the multilayer filter according to the modification example. This modification example is generally similar to or the same as the above-described embodiment. This modification example is different from the above-described embodiment in that the multilayer filter includes a bandpass filter with balanced-balanced characteristics. Hereinafter, the differences between the above-described embodiment and the modification example will be mainly described.

In this modification example, a multilayer filter 1A includes a bandpass filter with balanced-balanced characteristics. The multilayer filter 1A includes conductor units 5A and 6A instead of the conductor units 5 and 6. As illustrated in FIG. 4, the conductor unit 5A includes three pairs of external electrodes 85a, 85b, and 85c spaced apart from each other. Each of the three pairs of external electrodes 85a, 85b, and 85c is connected to the conductor unit 6A.

One of each of the pair of external electrodes 85a, 85b, and 85c is provided on the side surface 2e and the main surfaces 2a and 2b, and is arranged in the X-axis direction. One of each of the pair of external electrodes 85a, 85b, and 85c extends in the Z-axis direction between the main surfaces 2a and 2b. The other of each of the pair of external electrodes 85a, 85b, and 85c is provided on the side surface 2f and the main surfaces 2a and 2b, and is arranged in the X-axis direction. The other of each of the pair of external electrodes 85a, 85b, and 85c extends in the Z-axis direction between the main surfaces 2a and 2b.

The conductor unit 6A is provided inside the multilayer body 3. The conductor unit 6A includes an input/output portion 10A and a plurality of electrical circuits 20A. The plurality of electrical circuits 20A are electromagnetically connected to each other inside the multilayer body 3 to form one filter circuit.

Through the input/output portion 10A, input signals are transmitted to the plurality of electrical circuits 20A, and signals transmitted from the plurality of electrical circuits 20A are output. For example, a signal is input to the input/output portion 10A from the outside of the multilayer filter 1A, and a signal is output from the input/output portion 10 to the outside of the multilayer filter 1A. The input/output portion 10A includes an input/output port group including two pairs of balanced ports 11A and 12A and 13A and 14A. The pair of balanced ports 13A and 14A output balanced signals. In other words, a signal input and output to and from the balanced port 13A and a signal input and output to and from the balanced port 14A have opposite polarities.

The plurality of electrical circuits 20A are connected to the input/output portion 10. The plurality of electrical circuits 20A are electromagnetically connected to each other. The plurality of electrical circuits 20 include a plurality of resonant circuits. The plurality of electrical circuits 20 include electrical circuits 21A, 22A, 23A, 24A, 25A, 26A, 27A, 28A, 29A, 30A, 31A, and 32A. The electrical circuits 21A, 22A, 23A, and 24A include resonant circuits. The electrical circuits 21A, 22A, 23A, and 24A are, for example, LC resonant circuits.

Each of the electrical circuits 21A, 22A, 23A, and 24A forms an inductor and a capacitor. Among the electrical circuits 21A, 22A, 23A, and 24A, the electrical circuits 22A and 23A are adjacent to each other in a direction crossing the stacking direction of the plurality of dielectric layers 7, and are magnetically coupled to each other. In this modification example, the plurality of electrical circuits 21A, 22A, 23A, and 24A are arranged in the direction crossing the stacking direction of the plurality of dielectric layers 7. The plurality of electrical circuits 21A, 22A, 23A, and 24A are arranged in the X-axis direction. The electrical circuits 22A and 23A are arranged between the electrical circuit 21A and the electrical circuit 24A in the X-axis direction. The plurality of electrical circuits 21A, 22A, 23A, and 24A are electromagnetically connected to each other.

The electrical circuits 21A, 22A, 23A, 24A, 25A, 26A, 27A, 28A, 29A, 30A, 31A, and 32A are spaced apart from each other. The electrical circuits 21A, 22A, 23A, 24A, 25A, 26A, 27A, 28A, 29A, 30A, 31A, and 32A are electrically connected to each other.

Each electrical circuit 20A is formed by a plurality of conductors. Conductors forming each electrical circuit 20A contain at least one selected from Ag and Pd, for example. A plating layer is formed on the surface of each terminal electrode. The plated layer is formed, for example, by electroplating. The plating layer has such as a layer structure including a Cu plating layer, an Ni plating layer, and an Sn plating layer, or a layer structure including an Ni plating layer and an Sn plating layer.

As illustrated in FIG. 6, the electrical circuit 21A includes an inductor conductor 41A and capacitor conductors 91a, 91b, 91c, 91d, 91e, and 91f. The inductor conductor 41A corresponds to a coil. The inductor conductor 41A includes a pair of ends 41a and 41b. The inductor conductor 41A forms an inductor. The capacitor conductors 91a, 91b, 91c, 91d, 91e, and 91f form capacitors. In the electrical circuit 21A, the end 41a and the capacitor conductors 91a, 91b, and 91c are electrically connected to each other. The balanced port 11A and the end 41a are electrically connected to each other. In the electrical circuit 21, the end 41b and the capacitor conductors 91d, 91e, and 91f are electrically connected to each other.

In the multilayer filter 1A, the electrical circuit 21A corresponds to at least a part of the first resonant circuit. The capacitor conductors 91a and 91b correspond to first capacitor conductors forming a first capacitor. The capacitor conductor 91c corresponds to a jump capacitor conductor forming a jump capacitor. For example, the capacitor conductor 91c corresponds to a first jump capacitor conductor forming a first jump capacitor. The first jump capacitor conductor corresponds to a first electrode of a pair of electrodes forming the first jump capacitor.

The capacitor conductors 91d and 91e correspond to second capacitor conductors forming a second capacitor. The capacitor conductor 91f corresponds to a jump capacitor conductor forming a jump capacitor. For example, the capacitor conductor 91f corresponds to a second jump capacitor conductor forming a second jump capacitor. The second jump capacitor conductor corresponds to a first electrode of a pair of electrodes forming the second jump capacitor.

The electrical circuit 22A includes an inductor conductor 42A forming an inductor and capacitor conductors 92a, 92b, 92c, 92d, 92e, and 92f forming capacitors. The inductor conductor 42A corresponds to a coil. The inductor conductor 42A includes a pair of ends 42a and 42b. The inductor conductor 42A forms an inductor. The electrical circuit 21A and the electrical circuit 22A are connected to each other by AC coupling. A capacitor is formed by the capacitor conductor 91a and the capacitor conductor 92a. The capacitor conductors 92a, 92b, 92c, 92d, 92e, and 92f form capacitors.

In the electrical circuit 22A, the end 42a and the capacitor conductors 92a, 92b, and 92c are electrically connected to each other. In the electrical circuit 22A, the end 42b and the capacitor conductors 92d, 92e, and 92f are electrically connected to each other. In the multilayer filter 1A, the electrical circuit 22A corresponds to at least a part of the second resonant circuit. The capacitor conductors 92a, 92b, and 92c correspond to first capacitor conductors forming a first capacitor. The capacitor conductors 92d, 92e, and 92f correspond to second capacitor conductors forming a second capacitor.

The electrical circuit 23A includes an inductor conductor 43A forming an inductor and capacitor conductors 93a, 93b, 93c, 93d, 93e, and 93f forming capacitors. The inductor conductor 43A corresponds to a coil. The inductor conductor 43A includes a pair of ends 43a and 43b. The inductor conductor 43A forms an inductor. The capacitor conductors 93a, 93b, 93c, 93d, 93e, and 93f form capacitors. In the electrical circuit 23A, the end 43a and the capacitor conductors 93a, 93b, and 93c are electrically connected to each other. In the electrical circuit 23A, the end 43b and the capacitor conductors 93d, 93e, and 93f are electrically connected to each other.

In the multilayer filter 1A, the electrical circuit 23A corresponds to at least a part of the third resonant circuit. The capacitor conductors 93a, 93b, and 93c correspond to first capacitor conductors forming a first capacitor. The capacitor conductors 93d, 93e, and 93f correspond to second capacitor conductors forming a second capacitor.

The electrical circuit 24A includes an inductor conductor 44A forming an inductor and capacitor conductors 94a, 94b, 94c, 94d, 94e, and 94f forming capacitors. The inductor conductor 44A includes a pair of ends 44a and 44b. The inductor conductor 44A forms an inductor. The capacitor conductors 94a, 94b, 94c, 94d, 94e, and 94f form capacitors. In the electrical circuit 24A, the end 44a and the capacitor conductors 94a, 94b, and 94c are electrically connected to each other. The balanced port 13A and the end 44a are electrically connected to each other. In the electrical circuit 24A, the end 44b and the capacitor conductors 94d, 94e, and 94f are electrically connected to each other. The balanced port 14A and the end 44b are electrically connected to each other.

In the multilayer filter 1A, the electrical circuit 24A corresponds to at least a part of the fourth resonant circuit. The capacitor conductors 94a and 94b correspond to first capacitor conductors forming a first capacitor. The capacitor conductor 94c corresponds to a jump capacitor conductor forming a jump capacitor. For example, the capacitor conductor 94c corresponds to a first jump capacitor conductor forming a first jump capacitor. The first jump capacitor conductor corresponds to a second electrode of a pair of electrodes forming the first jump capacitor.

The capacitor conductors 94d and 94e correspond to second capacitor conductors forming a second capacitor. The capacitor conductor 94f corresponds to a jump capacitor conductor forming a jump capacitor. For example, the capacitor conductor 94f corresponds to a second jump capacitor conductor forming a second jump capacitor. The second jump capacitor conductor corresponds to a second electrode of a pair of electrodes forming the second jump capacitor.

The electrical circuit 25A includes capacitor conductors 95a and 95b forming a capacitor. The electrical circuit 22A and the electrical circuit 25A are connected to each other by AC coupling. A capacitor is formed by the capacitor conductor 91c and the capacitor conductor 95a. The electrical circuit 23A and the electrical circuit 25A are connected to each other by AC coupling. A capacitor is formed by the capacitor conductor 91e and the capacitor conductor 95b. In the electrical circuit 25A, the capacitor conductor 95a and the capacitor conductor 95b are electrically connected to each other.

The electrical circuit 26A includes capacitor conductors 96a and 96b forming a capacitor. The electrical circuit 21A and the electrical circuit 26A are connected to each other by AC coupling. A capacitor is formed by the capacitor conductor 92b and the capacitor conductor 96a. The electrical circuit 24A and the electrical circuit 26A are connected to each other by AC coupling. A capacitor is formed by the capacitor conductor 92e and the capacitor conductor 96b. In the electrical circuit 26A, the capacitor conductor 96a and the capacitor conductor 96b are electrically connected to each other.

The electrical circuit 27A includes capacitor conductors 97a and 97b forming a capacitor. The electrical circuit 21A and the electrical circuit 27A are connected to each other by AC coupling. A capacitor is formed by the capacitor conductor 93b and the capacitor conductor 97a. The electrical circuit 24A and the electrical circuit 27A are connected to each other by AC coupling. A capacitor is formed by the capacitor conductor 93f and the capacitor conductor 97b. In the electrical circuit 27A, the capacitor conductor 97a and the capacitor conductor 97b are electrically connected to each other.

The electrical circuit 28A includes capacitor conductors 98a and 98b forming a capacitor. The electrical circuit 22A and the electrical circuit 28A are connected to each other by AC coupling. A capacitor is formed by the capacitor conductor 94b and the capacitor conductor 98a. The electrical circuit 23A and the electrical circuit 28A are connected to each other by AC coupling. A capacitor is formed by the capacitor conductor 94e and the capacitor conductor 98b. In the electrical circuit 28A, the capacitor conductor 98a and the capacitor conductor 98b are electrically connected to each other.

The electrical circuit 29A includes capacitor conductors 99a and 99b forming a capacitor. The electrical circuit 21A and the electrical circuit 29A are connected to each other by AC coupling. A capacitor is formed by the capacitor conductor 91c and the capacitor conductor 99a. The electrical circuit 24A and the electrical circuit 28A are connected to each other by AC coupling. A capacitor is formed by the capacitor conductor 94c and the capacitor conductor 99b. In the electrical circuit 29A, the capacitor conductor 99a and the capacitor conductor 99b are electrically connected to each other.

A jump capacitor is formed by the electrical circuit 29A and the capacitor conductors 91c and 94c. For example, a first jump capacitor is formed by the electrical circuit 29A and the capacitor conductors 91c and 94c. The first jump capacitor connects the electrical circuit 21A and the electrical circuit 24A to each other by jumping over the electrical circuit 22A and the electrical circuit 23A arranged adjacent to each other in the X-axis direction. In other words, the first jump capacitor connects the electrical circuit 21A and the electrical circuit 24A, which are arranged so as to interpose the electrical circuit 22A and the electrical circuit 23A magnetically coupled to each other, to each other in the X-axis direction.

The electrical circuit 30A includes capacitor conductors 100a and 100b forming a capacitor. The electrical circuit 21A and the electrical circuit 30A are connected to each other by AC coupling. A capacitor is formed by the capacitor conductor 91f and the capacitor conductor 100a. The electrical circuit 24A and the electrical circuit 30A are connected to each other by AC coupling. A capacitor is formed by the capacitor conductor 94f and the capacitor conductor 100b. In the electrical circuit 30A, the capacitor conductor 100a and the capacitor conductor 100b are electrically connected to each other.

A jump capacitor is formed by the electrical circuit 30A and the capacitor conductors 91f and 94f. For example, a second jump capacitor is formed by the electrical circuit 30A and the capacitor conductors 91f and 94f. The second jump capacitor connects the electrical circuit 21A and the electrical circuit 24A to each other by jumping over the electrical circuit 22A and the electrical circuit 23A arranged adjacent to each other in the X-axis direction. In other words, the second jump capacitor connects the electrical circuit 21A and the electrical circuit 24A, which are arranged so as to interpose the electrical circuit 22A and the electrical circuit 23A magnetically coupled to each other, to each other in the X-axis direction. In the multilayer filter 1A, the capacitance of the first jump capacitor and the capacitance of the second jump capacitor are equivalent to each other. Here, in this specification, "capacitances are equivalent to each other" means that one capacitance value is within a range of ±20% of the other capacitance value.

The electrical circuit 31A includes capacitor conductors 101a and 101b forming a capacitor. The electrical circuit 22A and the electrical circuit 31A are connected to each other by AC coupling. A capacitor is formed by the capacitor conductor 92c and the capacitor conductor 101a. The electrical circuit 23A and the electrical circuit 31A are connected to each other by AC coupling. A capacitor is formed by the capacitor conductor 93c and the capacitor conductor 101b. In the electrical circuit 31A, the capacitor conductor 101a and the capacitor conductor 101b are electrically connected to each other. In the electrical circuit 31A, the capacitor conductors 101a and 101b are grounded.

The electrical circuit 32A includes capacitor conductors 102a and 102b forming a capacitor. The electrical circuit 22A and the electrical circuit 32A are connected to each other by AC coupling. A capacitor is formed by the capacitor conductor 92f and the capacitor conductor 102a. The electrical circuit 23A and the electrical circuit 32A are connected to each other by AC coupling. A capacitor is formed by the capacitor conductor 93f and the capacitor conductor 102b. In the electrical circuit 32A, the capacitor conductor 102a and the capacitor conductor 102b are electrically connected to each other. In the electrical circuit 32A, the capacitor conductors 102a and 102b are grounded.

As illustrated in FIGS. 4 and 5, the inductor conductors 41A, 42A, 43A, and 44A are arranged inside the multilayer body 3. The inductor conductors 42A and 43A have coil axes along a direction perpendicular to the stacking direction. The inductor conductors 42A and 43A have coil axes along the X-axis direction. The inductor conductors 41A and 44A have coil axes along the stacking direction. The inductor conductors 41A and 44A have coil axes along the Z-axis direction.

In the present embodiment, the inductor conductors 42A and 43A are single turn coils. The inductor conductors 41A and 44A are two-turn coils. Each of the inductor conductors 41A, 42A, 43A, and 44A includes, for example, at least one conductor layer 71 and a plurality of connection conductors 72. Each of the inductor conductors 41A, 42A, 43A, and 44A includes the conductor layer 71 and a plurality of vias 79.

Each of the pair of external electrodes 85a is connected to, for example, the electrical circuit 21A. For example, one of the pair of external electrodes 85a is connected to the balanced port 11A, and is connected to the connection conductor 72 of the end 41a of the inductor conductor 41A through the balanced port 11A. For example, the other of the pair of external electrodes 85a is connected to the balanced port 12A, and is connected to the connection conductor 72 of the end 41b of the inductor conductor 41A through the balanced port 12A.

Each of the pair of external electrodes 85b is connected to the electrical circuits 31A and 32A. One of the pair of external electrodes 85b is connected to the capacitor conductors 101a and 101b. The other of the pair of external electrodes 85b is connected to the capacitor conductors 102a and 102b.

Each of the pair of external electrodes 85c is connected to the electrical circuit 24A. For example, one of the pair of external electrodes 85c is connected to the balanced port 13A, and is connected to the connection conductor 72 of the end 43a of the inductor conductor 43A through the balanced port 13A. For example, the other of the pair of external electrodes 85c is connected to the balanced port 14A, and is connected to the connection conductor 72 of the end 41b of the inductor conductor 44A through the balanced port 14A.

Next, the function and effect of the multilayer filters 1 and 1A according to the present embodiment and its modification example will be described with reference to FIGS. 7 to 12.

In the multilayer filter 1, the input/output portion 10 includes an input/output port group including the unbalanced port 11 and a pair of balanced ports 13 and 14. In the multilayer filter 1A, the electrical circuit 22 and the electrical circuit 23 are magnetically coupled to each other. The electrical circuit 22 and the electrical circuit 23 are arranged between the electrical circuit 21 and the electrical circuit 24 in the direction A. The electrical circuits 21, 22, 23, and 24 correspond to resonant circuits. A jump capacitor is connected to the inductor conductor 41 of the electrical circuit 21 and the inductor conductor 44 of the electrical circuit 24. According to the configuration in which the electrical circuit 22 and the electrical circuit 23 are magnetically coupled to each other in this manner, a steep attenuation pole is formed. In addition, a steeper attenuation pole is formed by the jump capacitor. The multilayer filter 1A includes the input/output portion 10A instead of the input/output portion 10. The input/output portion 10A includes an input/output port group including two pairs of balanced ports 11A and 12A and 13A and 14A. In this case as well, the multilayer filter 1A can realize the function and effect similar to those of the multilayer filter 1.

Figure 7:
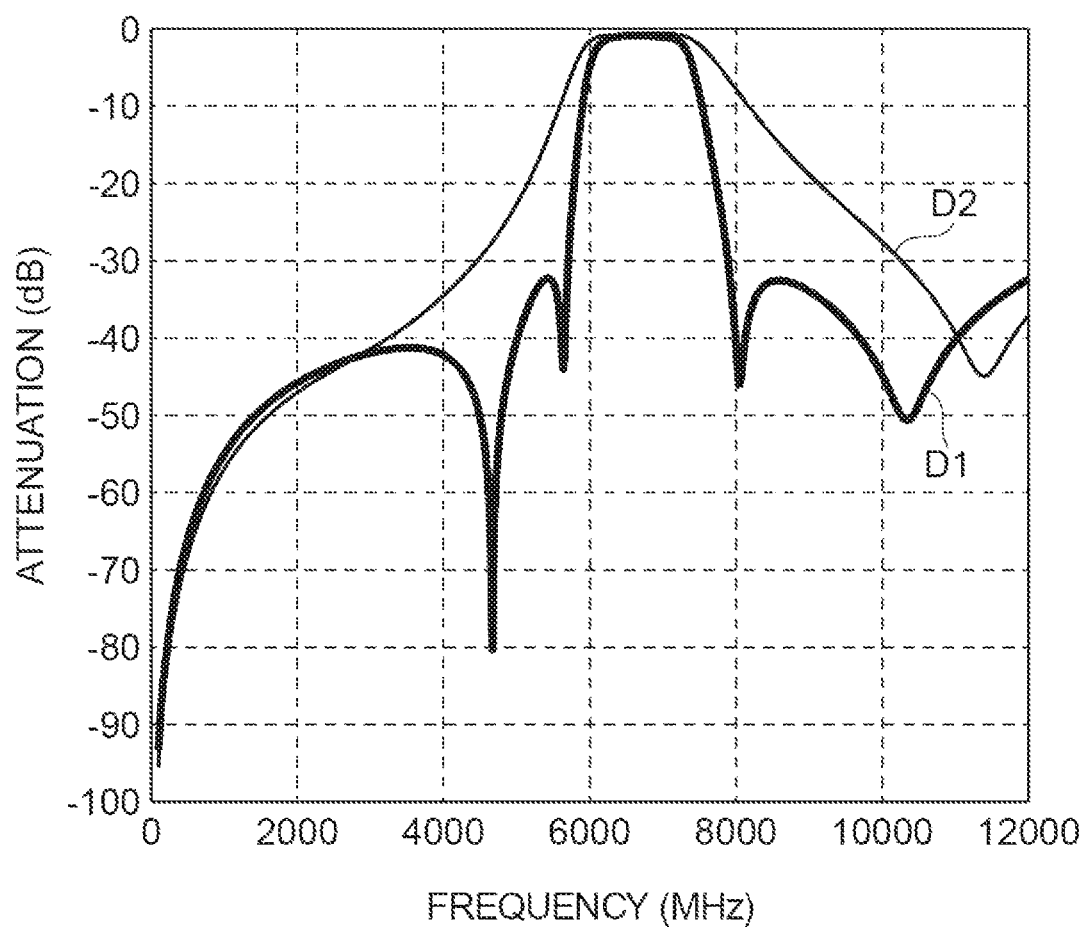
FIG. 7 is a diagram illustrating the characteristics of the multilayer filter according to the present embodiment.
Figure 8:
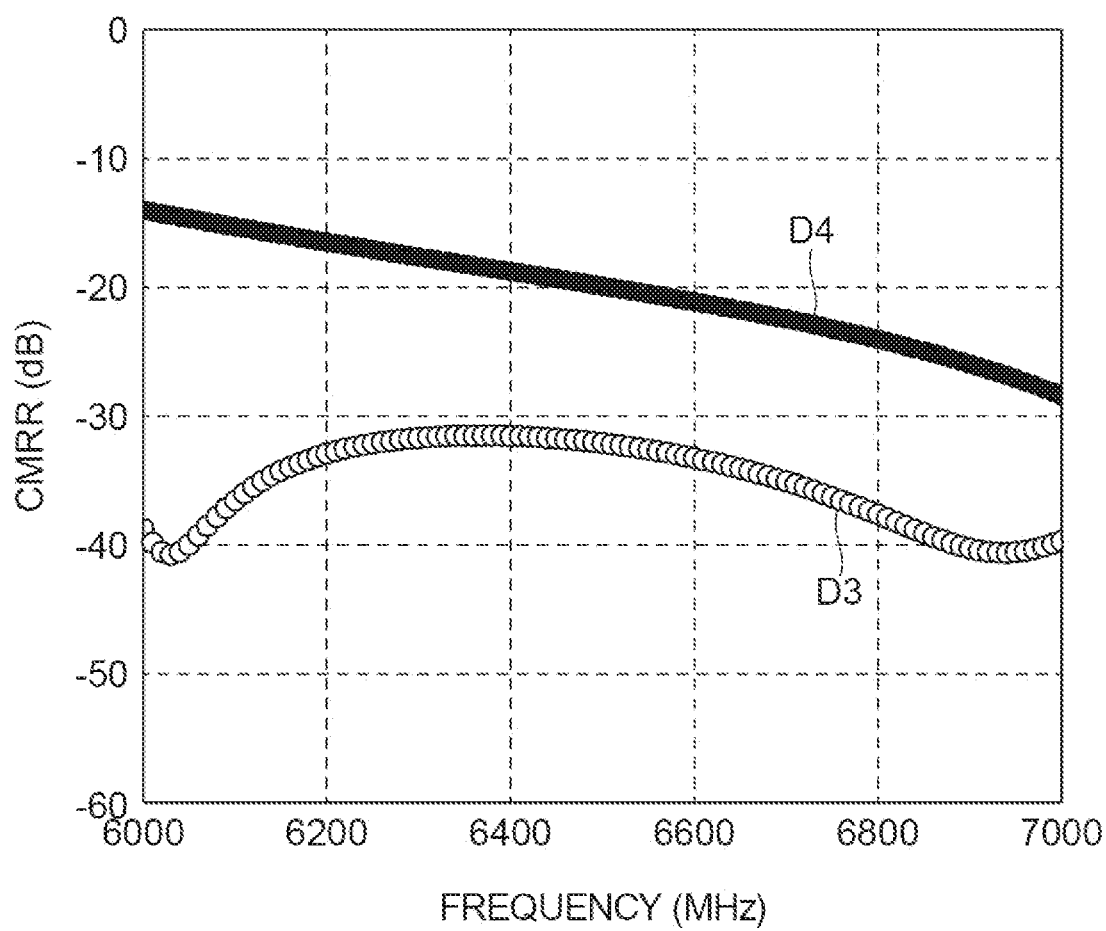
FIG. 8 is a diagram illustrating the characteristics of the multilayer filter.

For example, FIGS. 7 to 12 illustrate various characteristics of the multilayer filter 1. In FIGS. 7 and 8, data D1 and D3 indicate the characteristics of the multilayer filter 1 including four resonant circuits. Data D2 and D4 include the characteristics of a multilayer filter including three resonant circuits. In other words, the data D1 and D3 indicate the characteristics of a 4-pole multilayer filter, and the data D2 and D4 indicate the characteristics of a 3-pole multilayer filter.

The data D1 and the data D2 illustrate a relationship between a frequency passing through a multilayer filter and the amount of attenuation. As illustrated in FIG. 7, it was confirmed that a sharper attenuation occurred in the data D1 than in the data D2. In other words, it was confirmed that the data D1 was superior to the data D2 in terms of the amount of attenuation near the passband of 6000 to 7000 Hz.

The data D3 and the data D4 indicate a relationship between a frequency passing through a multilayer filter and a common mode rejection ratio (CMRR). As illustrated in FIG. 8, it was confirmed that the CMRR in the data D3 was reduced compared with the CMRR in the data D4 in the passband of 6000 to 7000 Hz. In this respect as well, it was confirmed that the data D1 was superior to the data D2 in terms of the amount of attenuation near the passband of 6000 to 7000 Hz.

Figure 9:
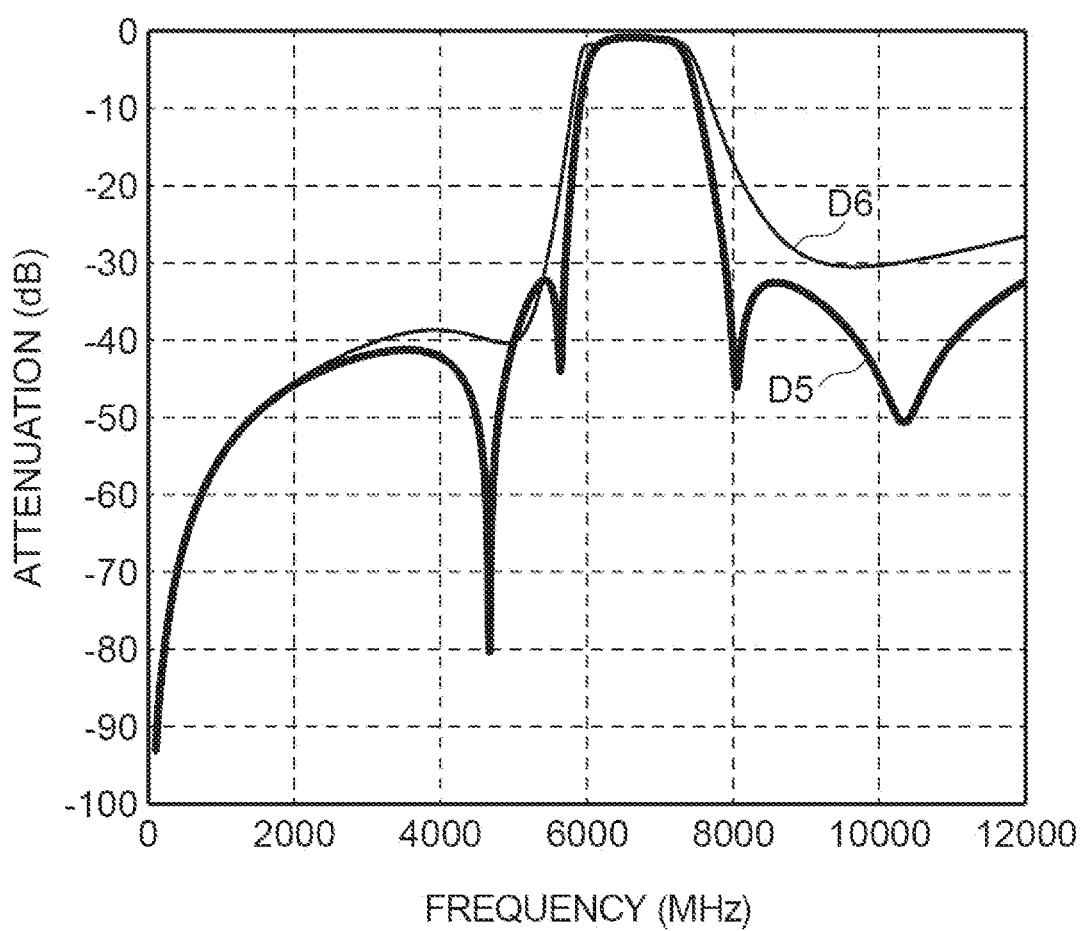
FIG. 9 is a diagram illustrating the characteristics of the multilayer filter.
Figure 10:
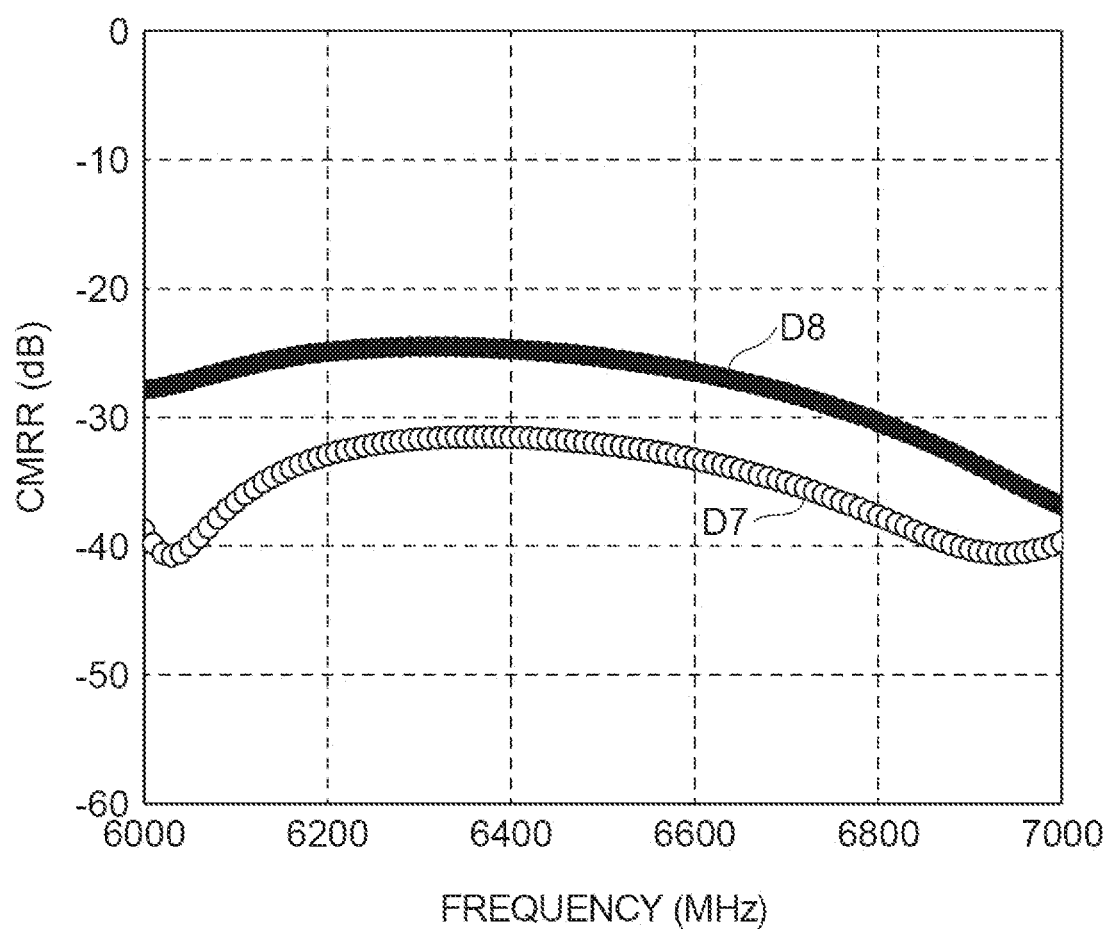
FIG. 10 is a diagram illustrating the characteristics of the multilayer filter.

In FIGS. 9 and 10, data D5 and D7 indicate the characteristics of the multilayer filter 1 including first and second jump capacitors. Data D6 and D8 include the characteristics of a multilayer filter that does not include a jump capacitor.

The data D5 and the data D6 illustrate a relationship between a frequency passing through a multilayer filter and the amount of attenuation. As illustrated in FIG. 9, it was confirmed that a sharper attenuation occurred in the data D5 than in the data D6. In other words, it was confirmed that the data D5 was superior to the data D6 in terms of the amount of attenuation near the passband of 6000 to 7000 Hz.

The data D7 and the data D8 illustrate a relationship between a frequency passing through a multilayer filter and the CMRR. As illustrated in FIG. 10, it was confirmed that the CMRR in the data D7 was reduced compared with the CMRR in the data D8 in the passband of 6000 to 7000 Hz. In this respect as well, it was confirmed that the data D7 was superior to the data D8 in terms of the amount of attenuation near the passband of 6000 to 7000 Hz.

In the multilayer filter 1, the capacitor conductor 51c of the first jump capacitor is connected to the end 42a of the inductor conductor 42 of the electrical circuit 21. The capacitor conductor 54c of the first jump capacitor is connected to the end 45a of the inductor conductor 45 of the electrical circuit 24. The capacitor conductor 51f of the second jump capacitor is connected to the end 42b of the inductor conductor 42 of the electrical circuit 21. The capacitor conductor 54f of the second jump capacitor is connected to the end 46a of the inductor conductor 46 of the electrical circuit 24. In this case, a steeper attenuation pole is formed. In particular, a low-frequency attenuation pole is formed steeply. Balanced characteristics can also be improved. The multilayer filter 1A also has a configuration similar to that of the multilayer filter 1.

Figure 11:
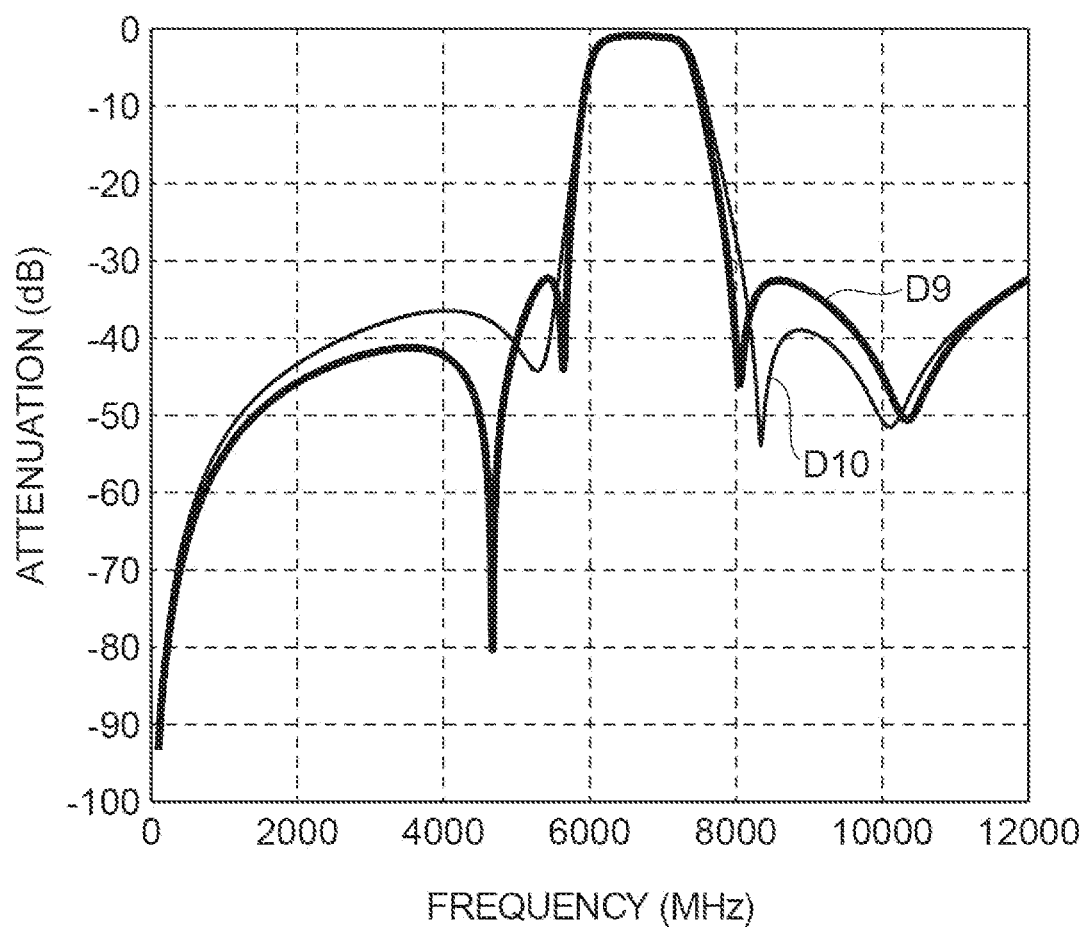
FIG. 11 is a diagram illustrating the characteristics of the multilayer filter.
Figure 12:
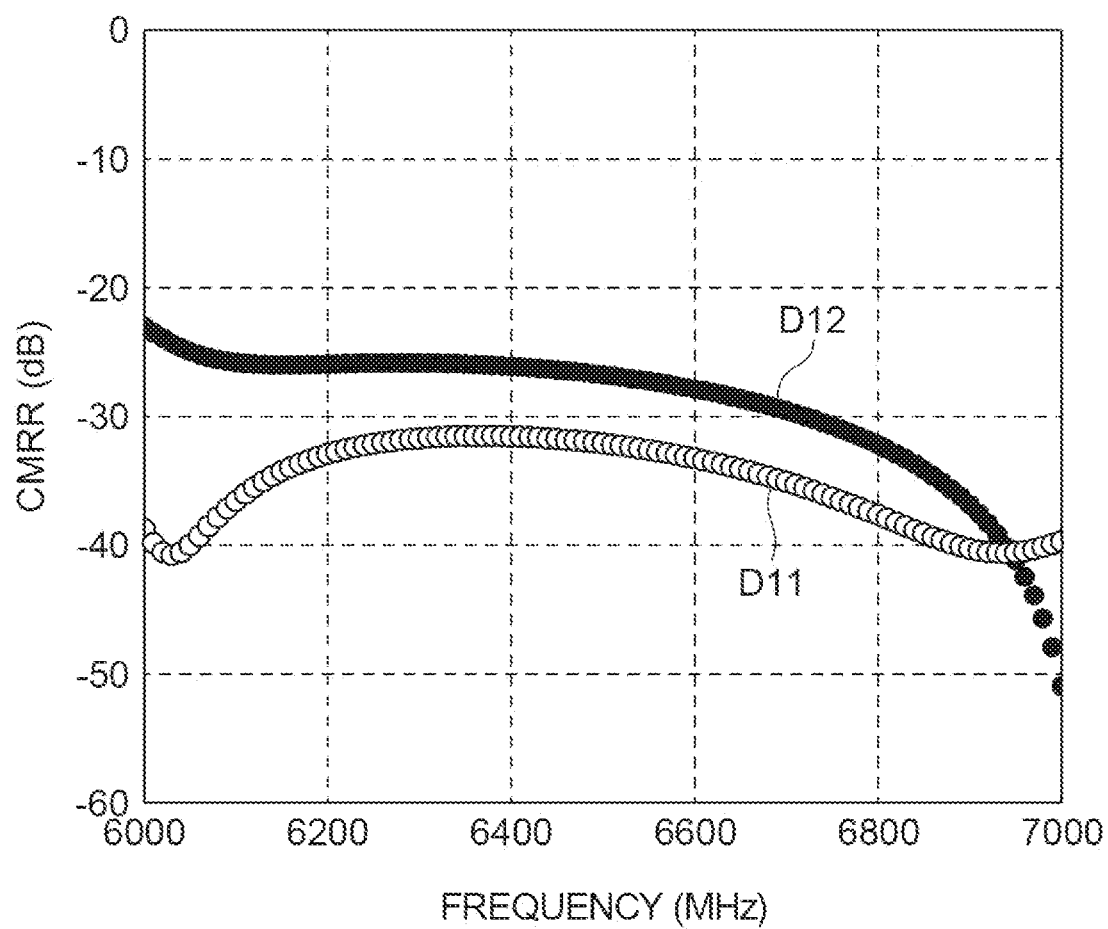
FIG. 12 is a diagram illustrating the characteristics of the multilayer filter.

In FIGS. 11 and 12, data D9 and D11 indicate the characteristics of the multilayer filter 1 including first and second jump capacitors. Data D10 and D12 include the characteristics of a multilayer filter that includes the first jump capacitor and does not include the second jump capacitor.

The data D9 and the data D10 illustrate a relationship between a frequency passing through a multilayer filter and the amount of attenuation. As illustrated in FIG. 11, it was confirmed that a sharper attenuation occurred in the data D9 than in the data D10. In other words, it was confirmed that the data D9 was superior to the data D10 in terms of the amount of attenuation near the passband of 6000 to 7000 Hz.

The data D11 and the data D12 illustrate a relationship between a frequency passing through a multilayer filter and the CMRR. As illustrated in FIG. 11, it was confirmed that the CMRR in the data D11 was reduced compared with the CMRR in the data D12 in the passband of 6000 to 7000 Hz. In this respect as well, it was confirmed that the data D11 was superior to the data D12 in terms of the amount of attenuation near the passband of 6000 to 7000 Hz.

In the multilayer filter 1, the input/output portion 10 includes an input/output port group including the unbalanced port 11 and a pair of balanced ports 13 and 14. The capacitance value of the first jump capacitor including the capacitor conductors 51c, 56a, 56b, and 54c is different from the capacitance value of the second jump capacitor including the capacitor conductors 52c, 55a, 55b, and 53b. In this case, the attenuation pole can be adjusted more reliably.

In the multilayer filter 1A, the input/output portion 10A includes an input/output port group including two pairs of balanced ports 11A and 12A and 13A and 14A. The capacitance value of the first jump capacitor including the capacitor conductors 91c, 99a, 99b, and 94c and the capacitance value of the second jump capacitor including the capacitor conductors 91f, 100a, 100b, and 94f may be equivalent to each other. In this case, the attenuation pole can be adjusted more reliably.

In the multilayer filter 1, the inductor conductor 44 of the electrical circuit 24 includes the inductor conductors 45 and 46 electrically connected to each other. The inductor conductor 45 includes the end 45a and the end 45b. The end 45b is connected to the inductor conductor 46. The inductor conductor 46 may include the end 46a and the end 46b. The end 46b is connected to the end 45b of the inductor conductor 45. A pair of balanced ports 13 and 14 included in the input/output portion 10 includes the balanced port 13 connected to the end 45a and the balanced port 14 connected to the end 46a. The end 45b and the end 46b are connected to the external terminal 15. In this case, for example, a ground terminal or an RF ground terminal can be connected to the external terminal 15. As a result, the attenuation pole can be adjusted more reliably.

The multilayer filter 1 further includes the capacitor conductors 52c, 55a, 55b, and 53b and the capacitor conductors 52f, 58a, 58b, and 53e that connect the inductor conductor 42 of the electrical circuit 22 and the inductor conductor 43 of the electrical circuit 23 to each other. In this case, the attenuation pole can be adjusted more easily. The multilayer filter 1A also has a configuration similar to this.

In the multilayer filter 1, the inductor conductor 41 includes the conductor layer 71 and a plurality of vias 79. The conductor layer 71 extends in a direction crossing the stacking direction. The plurality of vias 79 are electrically connected to the conductor layer 71. The plurality of vias 79 are arranged in the stacking direction. According to this configuration, in a compact multilayer filter, the length of the conductive path in the inductor conductor 41 can be secured. The multilayer filter 1A also has a similar configuration.

In the multilayer filter 1A, the electrical circuit 21 includes the inductor conductor 41, the capacitor conductors 51a, 51b, and 51c, and the capacitor conductors 51d, 51e, and 51f. The inductor conductor 41 has the ends 41a and 41b. The capacitor conductors 51a, 51b, and 51c are connected to the end 41a. The capacitor conductors 51d, 51e, and 51f are connected to the end 41b. In this case, in the multilayer filter 1A having balanced-balanced characteristics, high-frequency spurious can be reduced.

In the multilayer filter 1A, the electrical circuit 21A and the electrical circuit 24A have configurations that are mirror-symmetrical to each other. In this case, it is possible to realize a multilayer filter in which variations are suppressed and a desired impedance is secured.

In the multilayer filter 1A, the coil axes of the inductor conductors 41A and 44A cross the coil axes of the inductor conductor 42A and 43A. In this case, magnetic coupling between the inductor conductors 41A and 42A and the inductor conductors 43A and 44A is suppressed.

While the embodiment of the present invention and its modification example have been described above, the present invention is not necessarily limited to the embodiment and its modification example described above, and various changes can be made without departing from the scope of the present invention.

For example, in the embodiment and its modification example described above, the electrical circuits 21 and 24 may be coils wound once or three or more times around the coil axis. The electrical circuits 22 and 23 may be coils wound multiple times around the coil axis.

As can be understood from the description of the above embodiment, this specification includes disclosure of the aspects described below.

(Note 1)

A multilayer filter, including:
a multilayer body in which a plurality of dielectric layers are stacked; and
a conductor unit provided inside the multilayer body,
wherein the conductor unit includes an input/output portion, first, second, third, and fourth resonant circuits connected to the input/output portion, and a jump capacitor connecting the first resonant circuit and the fourth resonant circuit to each other,
the input/output portion includes an input/output port group including an unbalanced port and a pair of balanced ports or an input/output port group including two pairs of balanced ports,
each of the first, second, third, and fourth resonant circuits includes an inductor conductor including first and second ends, a first capacitor conductor connected to the first end, and a second capacitor conductor connected to the second end,
among the first, second, third, and fourth resonant circuits, the second and third resonant circuits are adjacent to each other in a first direction crossing a stacking direction of the plurality of dielectric layers and are magnetically coupled to each other,
the second and third resonant circuits are arranged between the first resonant circuit and the fourth resonant circuit,
a first electrode of the jump capacitor is connected to the inductor conductor of the first resonant circuit, and
a second electrode of the jump capacitor is connected to the inductor conductor of the fourth resonant circuit.

(Note 2)

The multilayer filter according to Note 1,
wherein the first, second, third, and fourth resonant circuits are arranged in the first direction crossing the stacking direction of the plurality of dielectric layers, and
the second and third resonant circuits are arranged between the first resonant circuit and the fourth resonant circuit in the first direction.

19

(Note 3)
The multilayer filter according to Note 1 or 2,
wherein the jump capacitor conductor includes a first jump capacitor conductor and a second jump capacitor conductor,
a first electrode of the first jump capacitor conductor is connected to the first end of the first resonant circuit,
a second electrode of the first jump capacitor conductor is connected to the first end of the fourth resonant circuit,
a first electrode of the second jump capacitor conductor is connected to the second end of the first resonant circuit, and
a second electrode of the second jump capacitor conductor is connected to the second end of the fourth resonant circuit.

(Note 4)
The multilayer filter according to Note 3,
wherein the input/output portion includes the input/output port group including the unbalanced port and the pair of balanced ports, and
a capacitance value of the first jump capacitor and a capacitance value of the second jump capacitor are different.

(Note 5)
The multilayer filter according to Note 3,
wherein the input/output portion includes the input/output port group including the two pairs of balanced ports, and
a capacitance value of the first jump capacitor and a capacitance value of the second jump capacitor are equivalent to each other.

(Note 6)
The multilayer filter according to any one of Notes 1 to 5, further including:
a capacitor conductor connecting the inductor conductor of the second resonant circuit and the inductor conductor of the third resonant circuit to each other.

(Note 7)
The multilayer filter according to any one of Notes 1 to 6,
wherein the inductor conductor of the fourth resonant circuit includes first and second inductor conductors electrically connected to each other,
the first inductor conductor includes the first end and a third end connected to the second inductor conductor,
the second inductor conductor includes the second end and a fourth end connected to the third end of the first inductor conductor,
the pair of balanced ports included in the input/output portion includes a balanced port connected to the first end and a balanced port connected to the second end, and
the third end and the fourth end are connected to an external terminal.

What is claimed is:

1. A multilayer filter, comprising:
a multilayer body in which a plurality of dielectric layers are stacked; and
a conductor unit provided inside the multilayer body,
wherein the conductor unit includes an input/output portion, first, second, third, and fourth resonant circuits connected to the input/output portion, and a jump capacitor connecting the first resonant circuit and the fourth resonant circuit to each other,
the input/output portion includes an input/output port group including an unbalanced port and a pair of balanced ports or an input/output port group including two pairs of balanced ports,

20 each of the first, second, third, and fourth resonant circuits includes an inductor conductor including first and second ends, a first capacitor conductor connected to the first end, and a second capacitor conductor connected to the second end,
among the first, second, third, and fourth resonant circuits, the second and third resonant circuits are adjacent to each other in a first direction crossing a stacking direction of the plurality of dielectric layers and are magnetically coupled to each other,
a first electrode of the jump capacitor is connected to the inductor conductor of the first resonant circuit, and
a second electrode of the jump capacitor is connected to the inductor conductor of the fourth resonant circuit.

2. The multilayer filter according to claim 1,
wherein the first, second, third, and fourth resonant circuits are arranged in the first direction crossing the stacking direction of the plurality of dielectric layers, and
the second and third resonant circuits are arranged between the first resonant circuit and the fourth resonant circuit in the first direction.

3. The multilayer filter according to claim 1,
wherein the jump capacitor includes a first jump capacitor and a second jump capacitor,
a first electrode of the first jump capacitor is connected to the first end of the first resonant circuit,
a second electrode of the first jump capacitor is connected to the first end of the fourth resonant circuit,
a first electrode of the second jump capacitor is connected to the second end of the first resonant circuit, and
a second electrode of the second jump capacitor is connected to the second end of the fourth resonant circuit.

4. The multilayer filter according to claim 3,
wherein the input/output portion includes the input/output port group including the unbalanced port and the pair of balanced ports, and
a capacitance value of the first jump capacitor and a capacitance value of the second jump capacitor are different.

5. The multilayer filter according to claim 3,
wherein the input/output portion includes the input/output port group including the two pairs of balanced ports, and
a capacitance value of the first jump capacitor and a capacitance value of the second jump capacitor are equivalent to each other.

6. The multilayer filter according to claim 1, further comprising:
a capacitor conductor connecting the inductor conductor of the second resonant circuit and the inductor conductor of the third resonant circuit to each other.

7. The multilayer filter according to claim 1,
wherein the inductor conductor of the fourth resonant circuit includes first and second inductor conductors electrically connected to each other,
the first inductor conductor includes the first end and a third end connected to the second inductor conductor,
the second inductor conductor includes the second end and a fourth end connected to the third end of the first inductor conductor, the pair of balanced ports included in the input/output portion includes a balanced port connected to the first end and a balanced port connected to the second end, and the third end and the fourth end are connected to an external terminal.

* * * * *